(12) United States Patent
Levinson et al.

(10) Patent No.: US 7,986,146 B2
(45) Date of Patent: Jul. 26, 2011

(54) METHOD AND SYSTEM FOR DETECTING EXISTENCE OF AN UNDESIRABLE PARTICLE DURING SEMICONDUCTOR FABRICATION

(75) Inventors: Harry J. Levinson, Saratoga, CA (US); Obert Reeves Wood, II, New York, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 948 days.

(21) Appl. No.: 11/606,440

(22) Filed: Nov. 29, 2006

(65) Prior Publication Data
US 2008/0124820 A1    May 29, 2008

(51) Int. Cl.
*G01R 31/08* (2006.01)
(52) U.S. Cl. ........ 324/525; 324/663; 324/686; 324/719; 700/121; 438/5; 438/13; 438/17; 702/84
(58) Field of Classification Search .................... 324/525
See application file for complete search history.

(56) References Cited

U.S. PATENT DOCUMENTS

| | | | |
|---|---|---|---|
| 3,716,782 A | | 2/1973 | Henry |
| 5,436,790 A | * | 7/1995 | Blake et al. ............ 361/234 |
| 5,511,005 A | * | 4/1996 | Abbe et al. ............ 702/84 |
| 6,198,982 B1 | * | 3/2001 | Park et al. ............ 700/121 |
| 6,377,060 B1 | * | 4/2002 | Burkhart et al. ........ 324/756.01 |
| 7,198,276 B2 | * | 4/2007 | Caldwell et al. ............ 279/128 |
| 7,394,640 B2 | * | 7/2008 | Hayakawa ............ 361/234 |
| 2005/0225308 A1 | | 10/2005 | Orvek |
| 2006/0007419 A1 | | 1/2006 | Streefkerk et al. |
| 2006/0097729 A1 | * | 5/2006 | Brown et al. ............ 324/525 |
| 2006/0240335 A1 | * | 10/2006 | Mitsui ................ 430/5 |
| 2007/0029740 A1 | * | 2/2007 | Natsuhara et al. ........ 279/3 |

* cited by examiner

*Primary Examiner* — Timothy J Dole
*Assistant Examiner* — Benjamin M Baldridge
(74) *Attorney, Agent, or Firm* — Farjami & Farjami LLP

(57) ABSTRACT

One exemplary embodiment is a method for detecting existence of an undesirable particle between a planar lithographic object, such as a semiconductor wafer or a lithographic mask, and a chuck during semiconductor fabrication. The exemplary method in this embodiment includes placing the planar lithographic object, such as the semiconductor wafer, over the chuck. The method further includes measuring a change in at least one electrical characteristic formed by and between the chuck and the planar lithographic object, such as measuring a change in capacitance between the chuck and semiconductor wafer, caused by the undesirable particle.

15 Claims, 8 Drawing Sheets

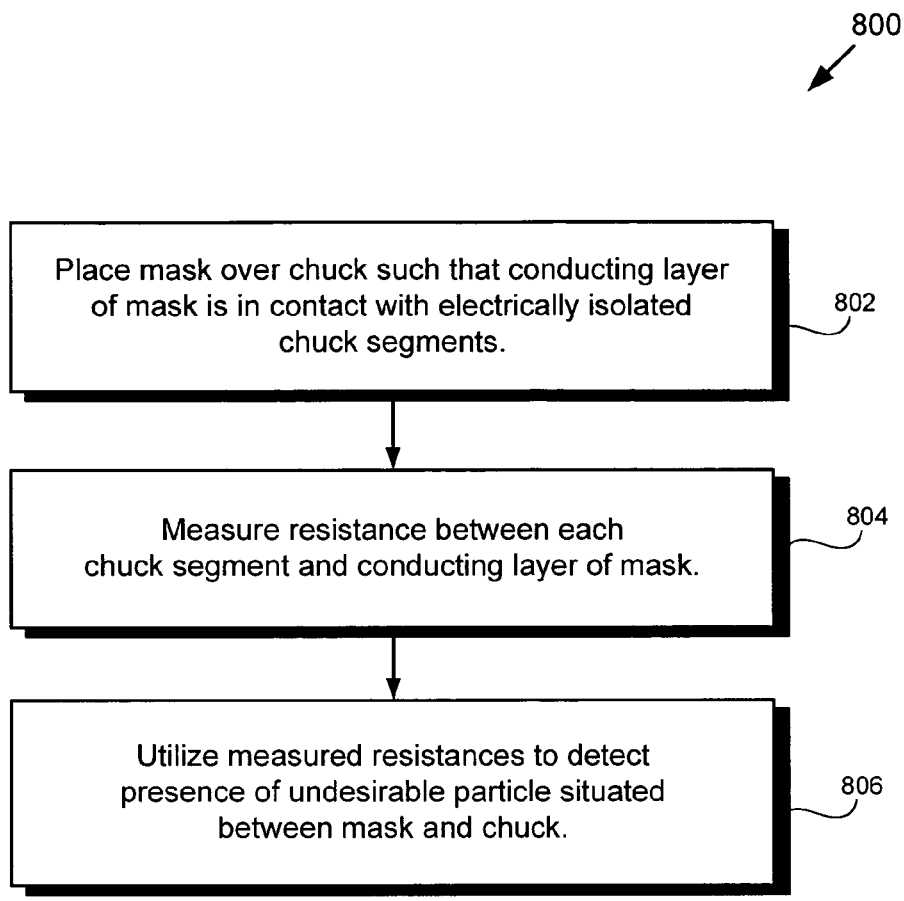

METHOD AND SYSTEM FOR DETECTING EXISTENCE OF AN UNDESIRABLE PARTICLE DURING SEMICONDUCTOR FABRICATION

TECHNICAL FIELD

The present invention relates generally to the field of semiconductor devices. More particularly, the present invention is related to semiconductor wafer fabrication.

BACKGROUND ART

Conventional semiconductor fabrication techniques such as optical lithography or extreme ultraviolet (EUV) lithography utilize a mask to form a pattern on a semiconductor wafer. In optical lithography, a semiconductor wafer is loaded onto a chuck, and a photomask is placed over the surface of the semiconductor wafer, thereby allowing a pattern on the photomask to be projected by a lens onto the semiconductor wafer. However, as new semiconductor wafers are introduced to the chuck during continued fabrication, undesired particles can appear and accumulate on the surface of the chuck, which can result in deformations on the surface of a semiconductor wafer placed on the chuck. These deformations can cause the pattern from the photomask to be out of focus on portions of the wafer and be inaccurately transferred onto the surface of the wafer, which can cause one or more dies on the wafer to become defective, thereby reducing yield and increasing manufacturing costs.

EUV lithography uses shorter wavelengths of light than conventional optical lithography, which can result in smaller patterning and hence more advanced semiconductor devices. In EUV lithography, a patterned reflective mask can be mounted on a chuck, and ultraviolet light can reflect the pattern through an optical system and onto a semiconductor wafer. However, similar to conventional optical lithography, undesired particles can accumulate between the chuck and the reflective mask and can cause inaccurate patterns to be formed on the wafer. This can cause one or more dies on the wafer to be defective, thereby increasing manufacturing costs by reducing yield.

In an attempt to reduce the number of undesired particles on the chuck, the chuck can be polished or cleaned before mounting each new semiconductor wafer or reflective mask. However, polishing or cleaning can damage the chuck and can cause significant downtime in the fabrication process, which also increases manufacturing costs.

SUMMARY

A method and system for detecting existence of an undesirable particle during semiconductor fabrication, substantially as shown in and/or described in connection with at least one of the figures, as set forth more completely in the claims.

BRIEF DESCRIPTION OF THE DRAWINGS

FIG. 8 is a flowchart illustrating steps taken to implement one embodiment of the present invention.

DETAILED DESCRIPTION OF THE INVENTION

The present invention is directed to a method and system for detecting existence of an undesirable particle during semiconductor fabrication. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention is an innovative system and method for detecting existence of undesirable particles situated between a "planar lithographic object" and a chuck during semiconductor wafer fabrication. In the present application, a "planar lithographic object" can be a semiconductor wafer or a lithographic mask, such as an EUV (extreme ultraviolet) lithographic mask.

Figure 1:
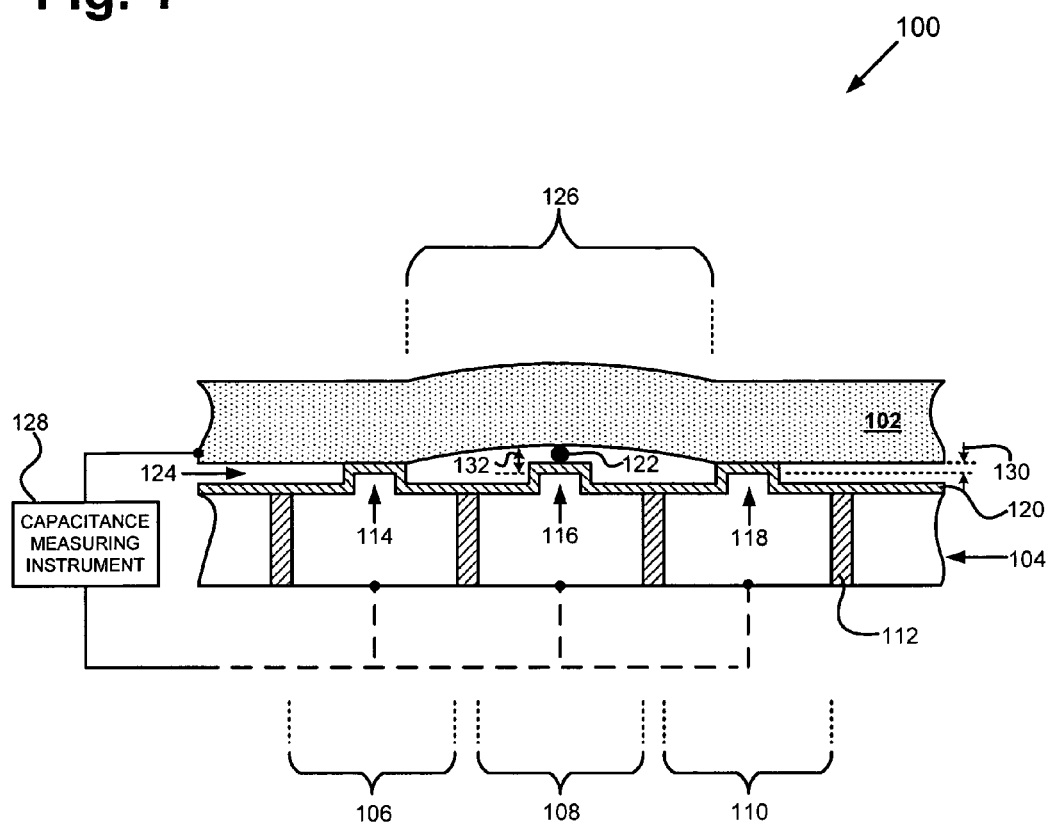
FIG. 1 illustrates an exemplary system for detecting existence of an undesirable particle during semiconductor fabrication in accordance with one embodiment of the present invention.

FIG. 1 shows system 100 for detecting existence of an undesirable particle during semiconductor fabrication (hereinafter referred to simply as "system 100"). System 100 includes semiconductor wafer 102, chuck 104, and capacitance measuring instrument 128. In the present example, chuck 104 includes chuck segments 106, 108, and 110, non-conducting layer 112, and mounting posts 114, 116, and 118. System 100 can be utilized to detect the existence of an undesirable particle, e.g., particle 122, situated between chuck 104 and semiconductor wafer 102. In the embodiment in FIG. 1, semiconductor wafer 102 is an example of a planar lithographic object.

Semiconductor wafer 102 can comprise a semiconductor material, such as silicon, and is situated over chuck 104. Chuck 104 can comprise titanium nitride, a material comprising silicon, or other suitable electrically conductive material that is compatible with semiconductor wafer 102 during semiconductor fabrication. In the present example, chuck 104 is divided into chuck segments 106, 108, and 110, which are electrically isolated from one another by non-conducting layers, such as non-conducting layer 112. Non-conducting layer 112 can comprise glass, a ceramic material, or other suitable dielectric material. Chuck segments 106, 108, and 110 include mounting posts 114, 116, and 118, respectively, which provide a platform on which semiconductor wafer 102 can be mounted.

Also shown in FIG. 1, the entire top surface of chuck 104 is covered by insulating layer 120, which can comprise glass, a ceramic material, or other suitable dielectric material. In another embodiment, insulating layer 120 can be deposited over mounting posts 114, 116, and 118 only, and not over the grooves of chuck 104, such as groove 124, for example.

During semiconductor fabrication, undesirable particles, such as particle 122, can be introduced into system 100. Particle 122 can be any type of foreign material, such as photosensitive material (photoresist), for example. Since mounting posts 114, 116, and 118 elevate semiconductor wafer 102 above the main surface of chuck 104, most undesirable particles that become situated in the grooves adjacent to the mounting posts, such as groove 124, do not adversely affect semiconductor wafer 102 during semiconductor fabrication. However, undesirable particles situated directly on mounting posts 114, 116, or 118 can cause deformities in semiconductor wafer 102 when it is mounted on chuck 104. Additionally, an undesirable particle situated in the grooves between mounting posts, such as groove 124, can cause deformities in semiconductor wafer 102 if the particle is large enough to extend above mounting posts 114, 116, and 118.

Further shown in FIG. 1, particle 122 is situated over mounting post 116 of chuck segment 108. Particle 122 can cause deformation region 126 to form in semiconductor wafer 102, which can cause a pattern on a photomask (not shown in FIG. 1) to be inaccurately focused on the top surface of semiconductor wafer 102 during wafer fabrication. Thus, detection and subsequent removal of undesirable particles situated between the mounting posts of chuck 104 and semiconductor wafer 102 is important to achieve accurate focus of the photomask pattern on the wafer.

In system 100, semiconductor wafer 102, which comprises a conductive material, and chuck segments 106, 108, and 110, which each comprise a conductive material, are separated by insulating layer 120, which comprises a dielectric, i.e., a non-conducting material. Thus, semiconductor wafer 102, chuck segments 106, 108, and 110, and insulating layer 120 can form multiple capacitors, where each capacitor includes semiconductor wafer 102 as one plate and a chuck segment as another plate. In system 100, the capacitance between each chuck segment, i.e., chuck segments 106, 108, and 110, and semiconductor wafer 102 can be measured by coupling capacitance measuring instrument 128 between the respective chuck segment and semiconductor wafer 102. For example, the capacitor between chuck segment 106 and semiconductor wafer 102 can be measured by coupling capacitance measuring instrument between chuck segment 106 and semiconductor wafer 102.

Also shown in FIG. 1, semiconductor wafer 102 is separated from chuck segments 106 and 110 by separation distance 130 and is separated from chuck segment 108 by separation distance 132. Since particle 122 is situated between chuck segment 108 and semiconductor wafer 102, particle 122 causes separation distance 132 to be greater than separation distance 130. However, the capacitance between two plates of a capacitor is inversely proportional to the distance between the plates. Thus, since separation distance 132 is greater than separation distance 130, the capacitance between semiconductor wafer 102 and chuck segment 108 can be smaller than the capacitance between semiconductor wafer 102 and either chuck segment 106 or chuck segment 110.

Thus, when an undesirable particle, such as particle 122, is situated between a chuck segment, such as chuck segment 108, and a semiconductor wafer, the undesirable particle causes an increase in the separation distance between the semiconductor wafer and the chuck segment, thereby causing a corresponding change in the capacitance between the chuck segment and the semiconductor wafer. Thus, by measuring the respective capacitances between semiconductor wafer 102 and chuck segments 106, 108, and 110, an undesirable particle situated between the semiconductor wafer and one or more of chuck segments can be detected. For example, respective capacitances between semiconductor wafer 102 and chuck segments 106, 108, and 110 can be measured by utilizing a measuring instrument, such as capacitance measuring instrument 128. A difference between one of the capacitances and the other capacitances can be used to detect the existence of an undesirable particle situated between the chuck segment corresponding to the different capacitance and the semiconductor wafer.

In one embodiment, the capacitance between each chuck segment and the semiconductor wafer can be measured by a capacitance measuring instrument and compared to an appropriately determined reference capacitance. A difference between a measured capacitance and the reference capacitance can be used to detect the existence of an undesirable particle situated between a corresponding chuck segment and the semiconductor wafer.

Thus, in the embodiment in FIG. 1, the invention achieves a system for advantageously detecting the presence of an undesirable particle situated between a semiconductor wafer and a chuck segment by detecting a change in capacitance caused by the particle.

Figure 2:
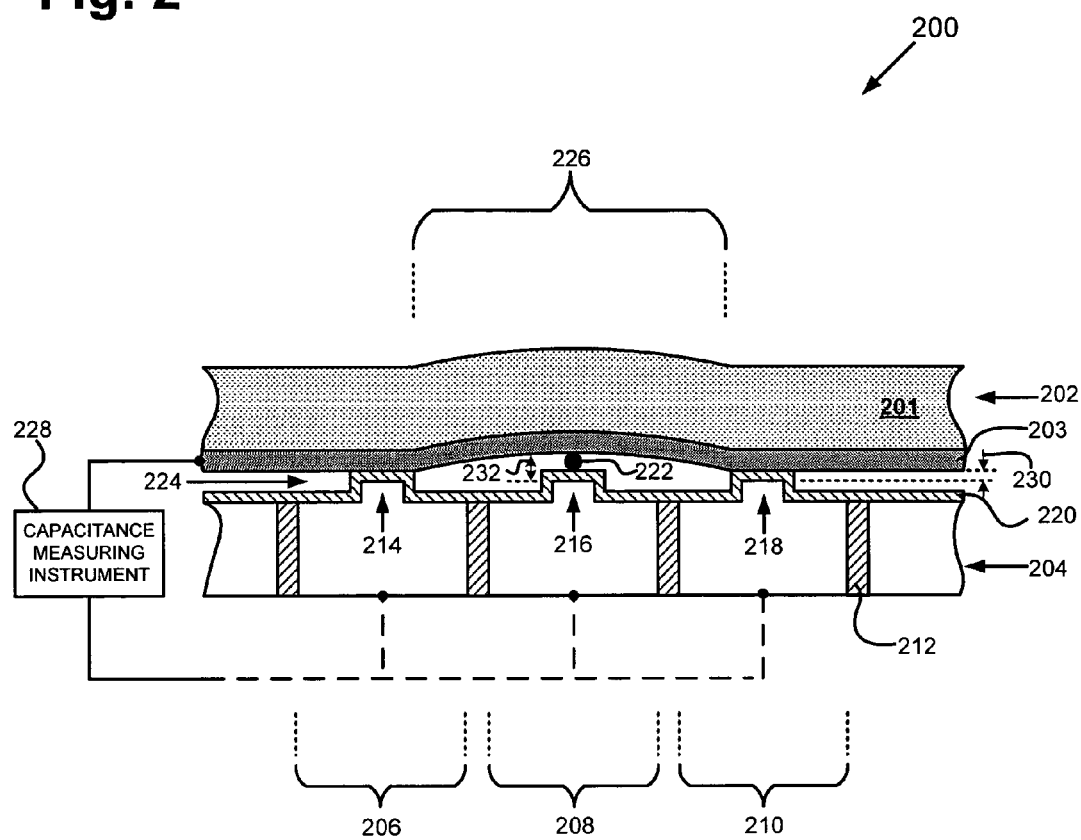
FIG. 2 illustrates an exemplary system for detecting existence of an undesirable particle during semiconductor fabrication in accordance with one embodiment of the present invention.

FIG. 2 shows system 200 for detecting existence of an undesirable particle during semiconductor fabrication (hereinafter referred to simply as "system 200"). In system 200, chuck 204, chuck segments 206, 208, and 210, non-conducting layer 212, mounting posts 214, 216, and 218, insulating layer 220, and capacitance measuring instrument 228 correspond, respectively, to chuck 104, chuck segments 106, 108, and 110, non-conducting layer 112, mounting posts 114, 116, and 118, insulating layer 120, and capacitance measuring instrument 128 in system 100 in FIG. 1. System 200 includes mask 202, chuck 204, and capacitance measuring instrument 228. Mask 202 includes substrate 201 and conducting layer 203. Chuck 204 includes chuck segments 206, 208, and 210, non-conducting layer 212, and mounting posts 214, 216, and 218. System 200 can be utilized to detect the existence of an undesirable particle, e.g., particle 222, situated between chuck 204 and mask 202. In the embodiment in FIG. 2, mask 202 is an example of a planar lithographic object.

As shown in FIG. 2, insulating layer 220 is situated over chuck 204 and can comprise glass, a ceramic material, or other suitable dielectric material. Also shown in FIG. 2, conducting layer 203 of mask 202 is situated over insulating layer 220 and conducting layer 203 is also situated on substrate 201 of mask 202. Mask 202 can be an EUV (extreme ultraviolet) reflective mask for use in EUV lithography, for example. Conducting layer 203 can comprise a metal or other suitable electrically conductive material and can be formed on the bottom surface of substrate 201 by utilizing a sputtering process or other suitable deposition processes. Substrate 201 of mask 202 can comprise a material with a very low coefficient of thermal expansion, such as glass.

Further shown in FIG. 2, chuck 204 is divided into chuck segments 206, 208, and 210, which are electrically isolated from one another by non-conducting layers, such as non-conducting layer 212. Chuck segments 206, 208, and 210 include mounting posts 214, 216, and 218, respectively, which provide a platform on which to mount mask 202 on chuck 204.

During semiconductor fabrication, undesirable particles, such as particle 222, can be introduced into system 200.

Particle 222 can be any type of foreign material, such as photosensitive material (photoresist), for example. Since mounting posts 214, 216, and 218 elevate mask 202 above the main surface of chuck 204, most undesirable particles that become situated in the grooves adjacent to the mounting posts, such as groove 224, do not adversely affect mask 202 during semiconductor fabrication. However, undesirable particles situated directly on mounting posts 214, 216, or 218 can cause deformities in mask 202 when it is mounted on chuck 204. Additionally, undesirable particles situated in the grooves between mounting posts, such as groove 224, can cause deformities in mask 202 if the particle is large enough to extend above mounting posts 214, 216, and 218.

Also shown in FIG. 2, particle 222 is situated over mounting post 216 of chuck segment 208 and can cause deformation region 226 to form in mask 202. Due to the sensitive nature of EUV lithography and extremely short wavelength of light used, deformation region 226 can cause improper pattern alignment on a semiconductor wafer (not shown in FIG. 2) during an EUV lithographic process. Thus, detection and subsequent removal of undesirable particles situated between the mounting posts of chuck 204 and mask 202 is important to achieve accurate pattern alignment on the wafer.

In system 200, a conductive material, i.e., conducting layer 203 of mask 202 and chuck segments 206, 208, and 210, which each comprise a conductive material, are separated by insulating layer 220, which comprises a dielectric, i.e., a non-conducting material. Thus, conducting layer 203, chuck segments 206, 208, and 210, and insulating layer 220 can form multiple capacitors, where each capacitor includes conducting layer 203 as one plate and a chuck segment as another plate. In system 200, the capacitance between each chuck segment, i.e., chuck segment 206, 208, or 210, and mask 202 can be measured by coupling capacitance measuring instrument 228 between the respective chuck segment and conducting layer 203 of mask 202. For example, the capacitor between chuck segment 206 and conducting layer 203 of mask 202 can be measured by coupling capacitance measuring instrument between chuck segment 206 and conducting layer 203 of mask 202.

Also shown in FIG. 2, conducting layer 203 of mask 202 is separated from chuck segments 206 and 210 by separation distance 230 and is separated from chuck segment 208 by separation distance 232. Since particle 222 is situated between chuck segment 208 and conducting layer 203 of mask 202, particle 222 causes separation distance 232 to be greater than separation distance 230. However, the capacitance between two plates of a capacitor is inversely proportional to the distance between the plates. Thus, since separation distance 232 is greater than separation distance 230, the capacitance between conducting layer 203 of mask 202 and chuck segment 208 can be smaller than the capacitance between conducting layer 203 of mask 202 and either chuck segment 206 or chuck segment 210.

Thus, when an undesirable particle, such as particle 222, is situated between a chuck segment, such as chuck segment 208, and a mask, such as mask 202, the undesirable particle causes an increase in the separation distance between the mask and the chuck segment, thereby causing a corresponding change in the capacitance between the chuck segment and the mask. Thus, by measuring the respective capacitances between conducting layer 203 of mask 202 and chuck segments 206, 208, and 210, an undesirable particle situated between the semiconductor mask and one or more of chuck segments can be detected. For example, respective capacitances between conducting layer 203 of mask 202 and chuck segments 206, 208, and 210 can be measured by utilizing a measuring instrument, such as capacitance measuring instrument 228. A difference between one of the capacitances and the other capacitances can be used to detect the existence of an undesirable particle situated between the chuck segment corresponding to the different capacitance and the mask.

In one embodiment, the capacitance between each chuck segment and the semiconductor mask can be measured by a capacitance measuring instrument and compared to an appropriately determined reference capacitance. A difference between a measured capacitance and the reference capacitance can be used to detect the existence of an undesirable particle situated between a corresponding chuck segment and the mask.

Thus, in the embodiment in FIG. 2, the invention achieves a system for advantageously detecting the presence of an undesirable particle situated between a semiconductor mask and a chuck segment by detecting a change in capacitance caused by the particle.

Figure 3:
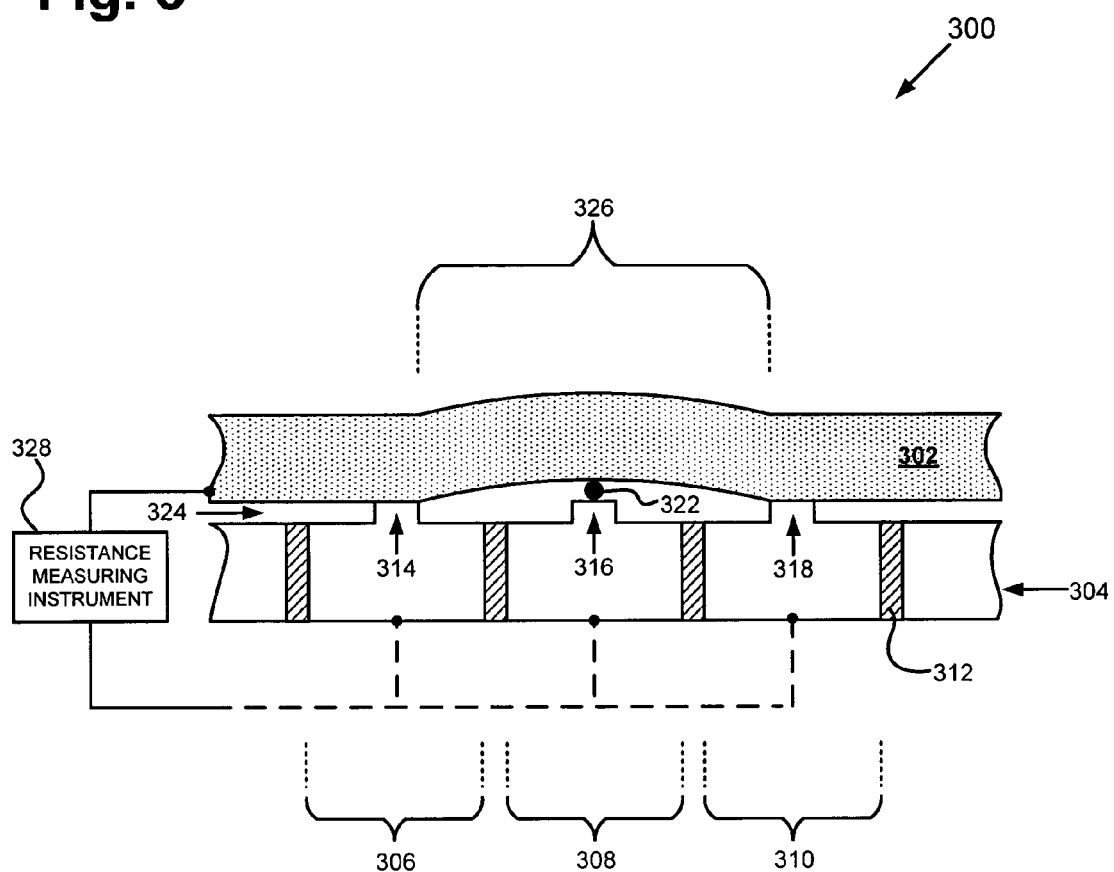
FIG. 3 illustrates an exemplary system for detecting existence of an undesirable particle during semiconductor fabrication in accordance with one embodiment of the present invention.

FIG. 3 shows system 300 for detecting existence of an undesirable particle during semiconductor fabrication (hereinafter referred to simply as "system 300"). In system 300, semiconductor wafer 302, chuck 304, chuck segments 306, 308, and 310, non-conducting layer 312, mounting posts 314, 316, and 318, correspond, respectively, to semiconductor wafer 102, chuck 104, chuck segments 106, 108, and 110, non-conducting layer 112, mounting posts 114, 116, and 118 in system 100 in FIG. 1. System 300 includes semiconductor wafer 302, chuck 304, and resistance measuring instrument 328. Chuck 304 includes chuck segments 306, 308, and 310, non-conducting layer 312, and mounting posts 314, 316, and 318. System 300 can be utilized to detect the existence of an undesirable particle, e.g., particle 322, situated between chuck 304 and semiconductor wafer 302. In the embodiment in FIG. 3, semiconductor wafer 302 is an example of a planar lithographic object.

As shown in FIG. 3, semiconductor wafer 302 is situated over chuck 304 and can comprise a semiconductor material, such as silicon. Chuck 304 is divided into chuck segments 306, 308, and 310, which are electrically isolated from one another by non-conducting layers, such as non-conducting layer 312. Chuck segments 306, 308, and 310 include mounting posts 314, 316, and 318, respectively, which provide a platform on which to mount semiconductor wafer 302 on chuck 304.

During semiconductor fabrication, undesirable particles, such as particle 322, can be introduced into system 300. Particle 322 can be any type of foreign material, such as photosensitive material (photoresist), for example. Since mounting posts 314, 316, and 318 elevate semiconductor wafer 302 above the main surface of chuck 304, most undesirable particles that become situated in the grooves adjacent to the mounting posts, such as groove 324, do not adversely affect semiconductor wafer 302 during semiconductor fabrication. However, undesirable particles situated directly on mounting posts 314, 316, or 318 can cause deformities in semiconductor wafer 302 when it is mounted on chuck 304. Additionally, undesirable particles situated in the grooves between mounting posts, such as groove 324, can cause deformities in semiconductor wafer 302 if the particle is large enough to extend above mounting posts 314, 316, and 318.

Further shown in FIG. 3, particle 322 is situated over mounting post 316 of chuck segment 308. Particle 322 can cause deformation region 326 to form in semiconductor wafer 302, which can cause a pattern on a photomask (not shown in FIG. 3) to be inaccurately focused on the top surface of semiconductor wafer 302 during wafer fabrication. Thus, detection and subsequent removal of undesirable particles situated between the mounting posts of chuck 304 and semiconductor wafer 302 is important to achieve accurate focus of the photomask pattern on the wafer.

In system 300, semiconductor wafer 302, which comprises a conductive material, and chuck segments 306, 308, and 310, which each comprise a conductive material, are in direct electrical contact with one another. In system 300, the resistance between each chuck segment, i.e., chuck segment 306, 308, or 310, and semiconductor wafer 302 can be measured by coupling resistance measuring instrument 328 between the respective chuck segment and semiconductor wafer 302. For example, the resistance of chuck segment 306 and semiconductor wafer 302 can be measured by coupling resistance measuring instrument between chuck segment 306 and semiconductor wafer 302.

Thus, when an undesirable particle, such as particle 322, is situated between a chuck segment, such as chuck segment 308, and a semiconductor wafer, the undesirable particle causes a change in the resistance between the semiconductor wafer and the chuck segment Thus, by measuring the respective resistances between semiconductor wafer 302 and chuck segments 306, 308, and 320, an undesirable particle situated between the semiconductor wafer and one or more of chuck segments can be detected. For example, respective resistances between semiconductor wafer 302 and chuck segments 306, 308, and 310 can be measured by utilizing a measuring instrument, such as resistance measuring instrument 328. A difference between one of the resistances and the other resistances can be used to detect the existence of an undesirable particle situated between the chuck segment corresponding to the different resistance and the semiconductor wafer.

In one embodiment, the resistance between each chuck segment and the semiconductor wafer can be measured by a resistance measuring instrument and compared to an appropriately determined reference resistance. A difference between a measured resistance and the reference resistance can be used to detect the existence of an undesirable particle situated between a corresponding chuck segment and the semiconductor wafer.

Thus, in the embodiment in FIG. 3, the invention achieves a system for advantageously detecting the presence of an undesirable particle situated between a semiconductor wafer and a chuck segment by detecting a change in resistance caused by the particle.

Figure 4:
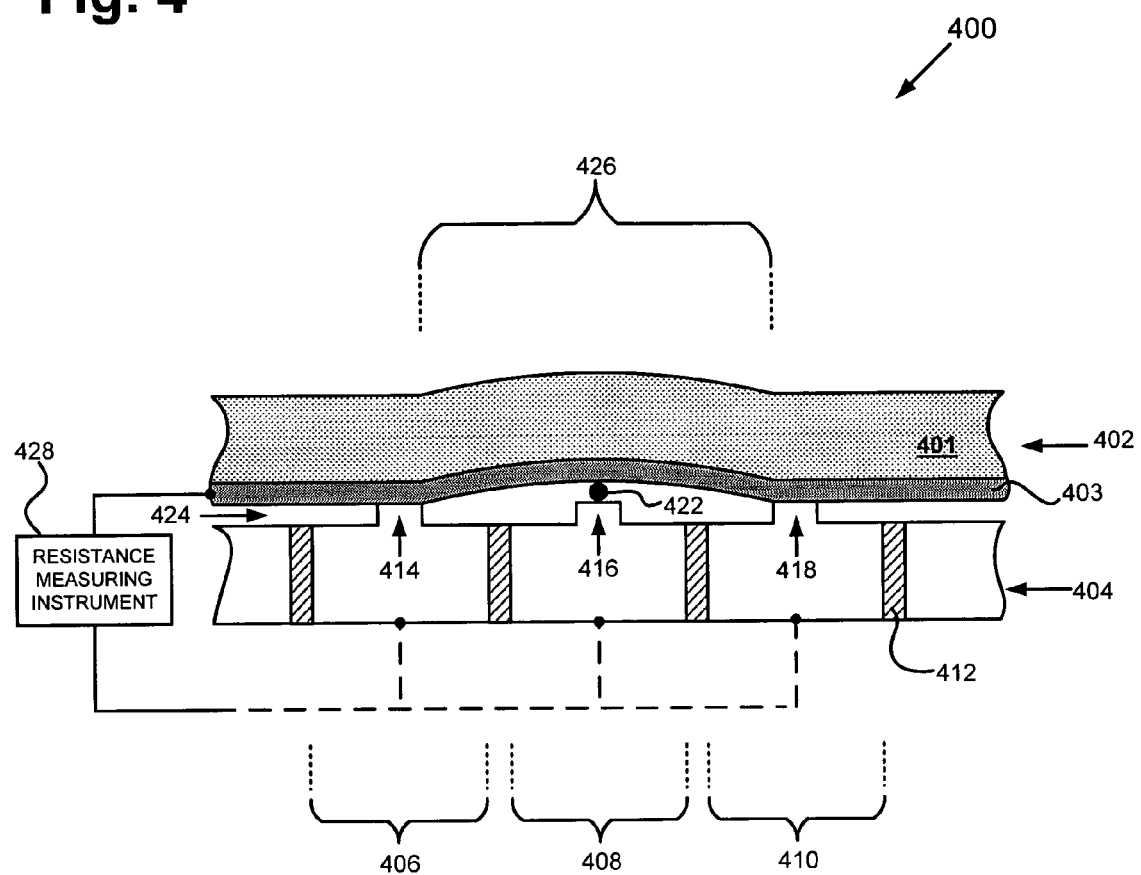
FIG. 4 illustrates an exemplary system for detecting existence of an undesirable particle during semiconductor fabrication in accordance with one embodiment of the present invention.

FIG. 4 shows system 400 for detecting existence of an undesirable particle during semiconductor fabrication (hereinafter referred to simply as "system 400"). In system 400, chuck 404, chuck segments 406, 408, and 410, non-conducting layer 412, mounting posts 414, 416, and 418, correspond, respectively, to chuck 104, chuck segments 106, 108, and 110, non-conducting layer 112, mounting posts 114, 116, and 118 in system 100 in FIG. 1. System 400 includes mask 402, chuck 404, and resistance measuring instrument 428. Mask 402 includes substrate 401 and conducting layer 403. Chuck 404 includes chuck segments 406, 408, and 410, non-conducting layer 412, and mounting posts 414, 416, and 418. System 400 can be utilized to detect the existence of an undesirable particle, e.g., particle 422, situated between chuck 404 and mask 402. In the embodiment in FIG. 4, mask 402 is an example of a planar lithographic object.

As shown in FIG. 4, conducting layer 403 of mask 402 is situated over chuck 404 and also situated on the bottom surface of substrate 401. Mask 402 can be an EUV (extreme ultraviolet) reflective mask for use in EUV lithography, for example. Conducting layer 403 can comprise a metal or other suitable electrically conductive material and can be formed on the bottom surface of substrate 401 by utilizing a sputtering process or other suitable deposition processes. Substrate 401 of mask 402 can comprise a material with a very low coefficient of thermal expansion, such as a low expansion glass. Further shown in FIG. 4, chuck 404 is divided into chuck segments 406, 408, and 410, which are electrically isolated from one another by non-conducting layers, such as non-conducting layer 412. Chuck segments 406, 408, and 410 include mounting posts 414, 416, and 418, respectively, which provide a platform on which to mount mask 402 on chuck 404.

During semiconductor fabrication, undesirable particles, such as particle 422, can be introduced into system 400. Particle 422 can be any type of foreign material, such as photosensitive material (photoresist), for example. Since mounting posts 414, 416, and 418 elevate mask 402 above the main surface of chuck 404, most undesirable particles that become situated in the grooves adjacent to the mounting posts, such as groove 424, do not adversely affect mask 402 during semiconductor fabrication. However, undesirable particles situated directly on mounting posts 414, 416, or 418 can cause deformities in mask 402 when it is mounted on chuck 404. Additionally, undesirable particles situated in the grooves between mounting posts, such as groove 424, can cause deformities in mask 402 if the particle is large enough to extend above mounting posts 414, 416, and 418.

Also shown in FIG. 4, particle 422 is situated over mounting post 416 of chuck segment 408. Particle 422 can cause deformation region 426 to form in mask 402. Due to the sensitive nature of EUV lithography and extremely short wavelength of light used, deformation region 426 can cause improper pattern alignment on a semiconductor wafer (not shown in FIG. 4) during an EUV lithographic process. Thus, detection and subsequent removal of undesirable particles situated between the mounting posts of chuck 404 and mask 402 is important to achieve accurate pattern alignment on the wafer.

In system 400, a conductive material, i.e., conducting layer 403 of mask 402, and chuck segments 406, 408, and 410, which each comprise a conductive material, are in direct electrical contact with one another. In system 400, the resistance between each of chuck segments 406, 408, and 410 and conducting layer 403 of mask 402 can be measured by coupling resistance measuring instrument 428 between the respective chuck segment and conducting layer 403. For example, the resistance between chuck segment 406 and mask 402 can be measured by coupling resistance measuring instrument between chuck segment 406 and conducting layer 403.

When an undesirable particle, such as particle 422, is situated between a chuck segment, such as chuck segment 408, and a conducting layer of a mask, such as conducting layer 403 of mask 402, the undesirable particle causes a change in the resistance between the conducting layer of the mask and the chuck segment. Thus, by measuring the respective resistances between conducting layer 403 of mask 402 and chuck segments 406, 408, and 420, an undesirable particle situated between the conducting layer of the mask and one or more of chuck segments can be detected. For example, respective resistances between conducting layer 403 and chuck segments 406, 408, and 410 can be measured by utilizing a measuring instrument, such as resistance measuring instrument 428. A difference between one of the resistances and the other resistances can be used to detect the existence of an undesirable particle situated between the chuck segment corresponding to the different resistance and the mask.

In one embodiment, the resistance between each chuck segment and the mask can be measured by a resistance measuring instrument and compared to an appropriately determined reference resistance. A difference between a measured resistance and the reference resistance can be used to detect the existence of an undesirable particle situated between a corresponding chuck segment and the mask.

Thus, in the embodiment in FIG. 4, the invention achieves a system for advantageously detecting the presence of an undesirable particle situated between a conducting layer of a mask and a chuck segment by detecting a change in resistance caused by the particle.

Figure 5:
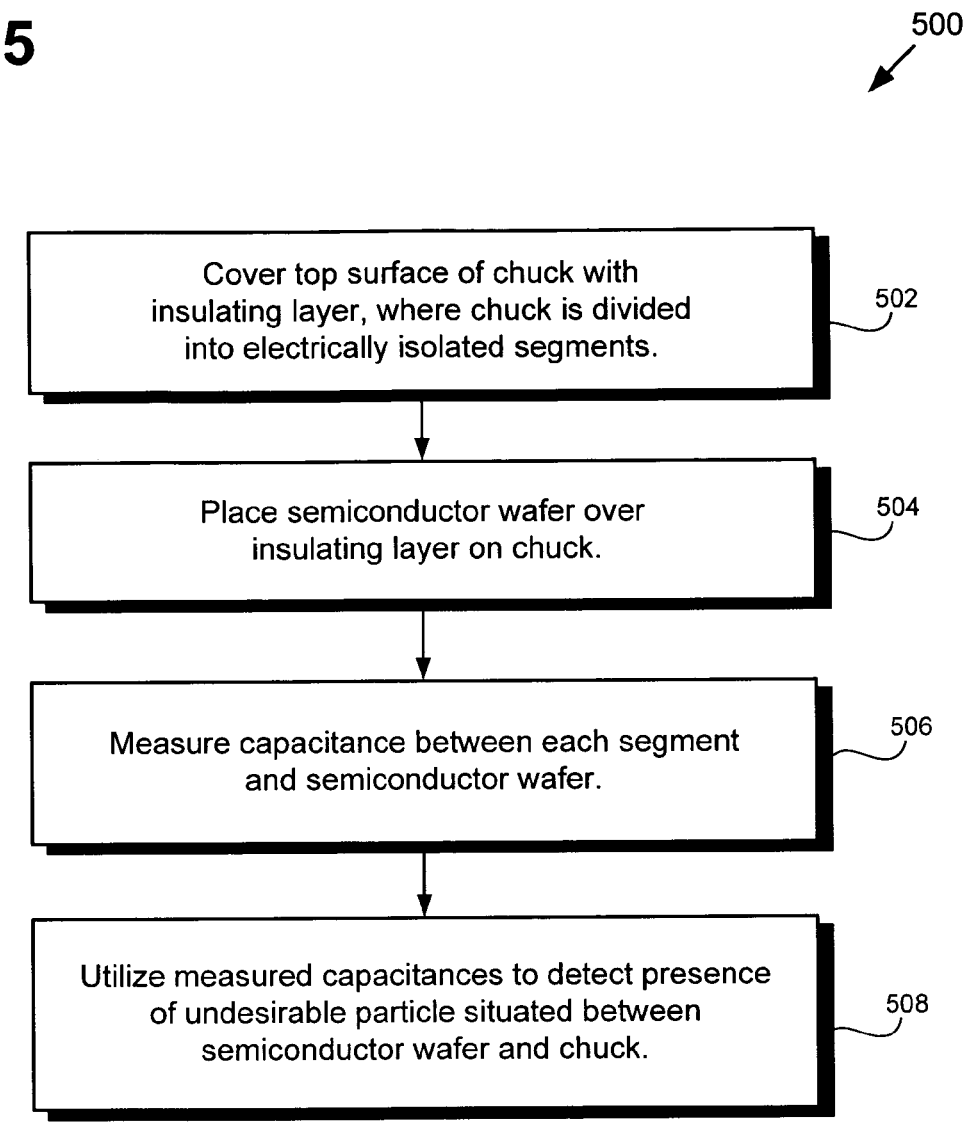
FIG. 5 is a flowchart illustrating steps taken to implement one embodiment of the present invention.

FIG. 5 shows a flowchart illustrating an exemplary method according to an embodiment of the present invention. Certain details and features have been left out of flowchart 500 that are apparent to a person of ordinary skill in the art. For example, a step may consist of one or more substeps or may involve specialized equipment or materials, as known in the art.

System 100 in FIG. 1 is utilized to illustrate the method steps in flowchart 500. At step 502 of flowchart 500, the top surface of chuck 104 is covered with insulating layer 120, which can comprise glass, a ceramic material, or other suitable dielectric material. Chuck 104, which is divided into electrically isolated chuck segments 106, 108, and 110 by non-conducting layer 112, can comprise titanium nitride, a material comprising silicon, or other suitable electrically conductive materials, for example.

At step 504 of flowchart 500, semiconductor wafer 102 is placed over insulating layer 120 on chuck 104. Semiconductor wafer 102, which comprises a conductive material, and chuck segments 106, 108, and 110, which each comprise a conductive material, are separated by insulating layer 120, which comprises a dielectric, i.e., a non-conducting material. Thus, semiconductor wafer 102, chuck segments 106, 108, and 110, and insulating layer 120 can form multiple capacitors, where each capacitor includes semiconductor wafer 102 as one plate and a chuck segment as another plate.

At step 506 of flowchart 500, the capacitance between each chuck segment, i.e., chuck segments 106, 108, and 110, and semiconductor wafer 102 can be measured by coupling capacitance measuring instrument 128 between the respective chuck segment and semiconductor wafer 102. For example, the capacitance between chuck segment 106 and semiconductor wafer 102 can be measured by coupling capacitance measuring instrument between chuck segment 106 and semiconductor wafer 102.

At step 508 of flowchart 500, the capacitances measured at step 506 of flowchart 500 are utilized to detect the presence of an undesirable particle situated between semiconductor wafer 102 and chuck 104. When an undesirable particle, such as particle 122, is situated between a chuck segment, such as chuck segment 108, and semiconductor wafer 102, the undesirable particle causes an increase in the separation distance between the semiconductor wafer and the chuck segment, thereby causing a corresponding change in the capacitance between the chuck segment and the semiconductor wafer. Thus, by measuring the respective capacitances between semiconductor wafer 102 and chuck segments 106, 108, and 110, an undesirable particle situated between the semiconductor wafer and one or more of chuck segments can be detected. A difference between one of the capacitances and the other capacitances can be used to detect the existence of an undesirable particle situated between the chuck segment corresponding to the different capacitance and the semiconductor wafer.

In one embodiment, the capacitance between each chuck segment and the semiconductor wafer can be measured by a capacitance measuring instrument and compared to an appropriately determined reference capacitance. A difference between a measured capacitance and the reference capacitance can be used to detect the existence of an undesirable particle situated between a corresponding chuck segment and the semiconductor wafer.

Thus, in the embodiment in FIG. 5, the invention achieves a method for advantageously detecting the presence of an undesirable particle situated between a mask and a chuck segment by detecting a change in capacitance caused by the particle.

Figure 6:
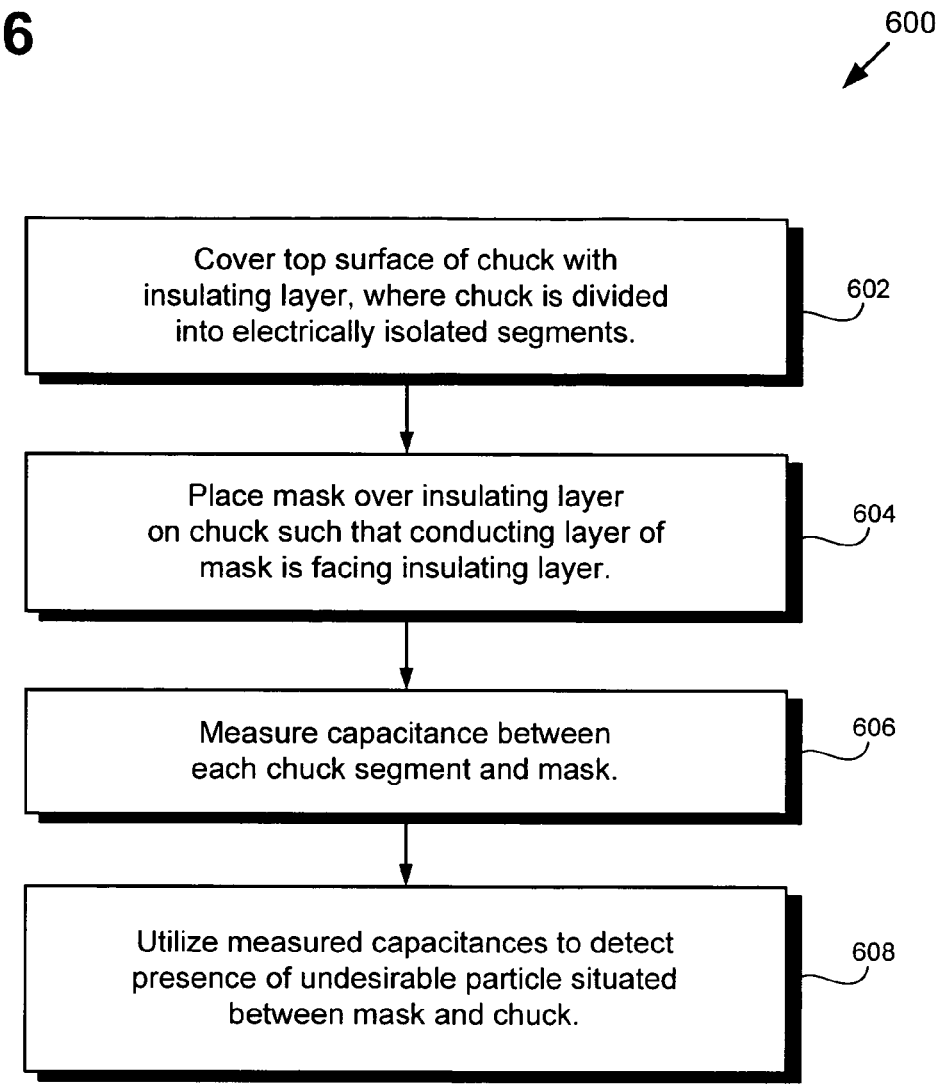
FIG. 6 is a flowchart illustrating steps taken to implement one embodiment of the present invention.

FIG. 6 shows a flowchart illustrating an exemplary method according to an embodiment of the present invention. Certain details and features have been left out of flowchart 600 that are apparent to a person of ordinary skill in the art. For example, a step may consist of one or more substeps or may involve specialized equipment or materials, as known in the art.

System 200 in FIG. 2 is utilized to illustrate the method steps in flowchart 600. At step 602 of flowchart 600, the top surface of chuck 204 is covered with insulating layer 220, which can comprise glass, a ceramic material, or other suitable dielectric material. Chuck 204, which is divided into electrically isolated chuck segments 206, 208, and 210 by non-conducting layers, such as non-conducting layer 212, can comprise titanium nitride, a material comprising silicon, or other suitable electrically conductive materials.

At step 604 of flowchart 600, mask 202, which includes conducting layer 203 and substrate 201, is placed over insulating layer 220 on chuck 204 such that conducting layer 203 of mask 202 is facing insulating layer 220. Mask 202 can be an EUV (extreme ultraviolet) reflective mask for use in EUV lithography, for example. Conducting layer 203 of mask 202, which comprises a conductive material, and chuck segments 206, 208, and 210, which each comprise a conductive material, are separated by insulating layer 220, which comprises a dielectric, i.e., a non-conducting material. Thus, mask 202, chuck segments 206, 208, and 210, and insulating layer 220 can form multiple capacitors, where each capacitor includes conducting layer 203 of mask 202 as one plate and a chuck segment as another plate.

At step 606 of flowchart 600, the capacitance between each chuck segment, i.e., chuck segments 206, 208, and 210, and conducting layer 203 of mask 202 is measured by coupling capacitance measuring instrument 228 between the respective chuck segment and conducting layer 203. For example, the capacitance between chuck segment 206 and conducting layer 203 of mask 202 can be measured by coupling capacitance measuring instrument between chuck segment 206 and conducting layer 203 of mask 202.

At step 608 of flowchart 600, the capacitances measured at step 606 of flowchart 600 are utilized to detect the presence of an undesirable particle situated between mask 202 and chuck 204. When an undesirable particle, such as particle 222, is situated between a chuck segment, such as chuck segment 208, and mask 202, the undesirable particle causes an increase in the separation distance between the mask and the chuck segment, thereby causing a corresponding change in the capacitance between the chuck segment and the mask. Thus, by measuring the respective capacitances between mask 202 and chuck segments 206, 208, and 210, an undesirable particle situated between the mask and one or more of chuck segments can be detected. A difference between one of the capacitances and the other capacitances can be used to detect the existence of an undesirable particle situated between the chuck segment corresponding to the different capacitance and the mask.

In one embodiment, the capacitance between each chuck segment and the mask can be measured by a capacitance measuring instrument and compared to an appropriately determined reference capacitance. A difference between a measured capacitance and the reference capacitance can be used to detect the existence of an undesirable particle situated between a corresponding chuck segment and the mask.

Thus, in the embodiment in FIG. 6, the invention achieves a method for advantageously detecting the presence of an undesirable particle situated between a mask and a chuck segment by detecting a change in capacitance caused by the particle.

Figure 7:
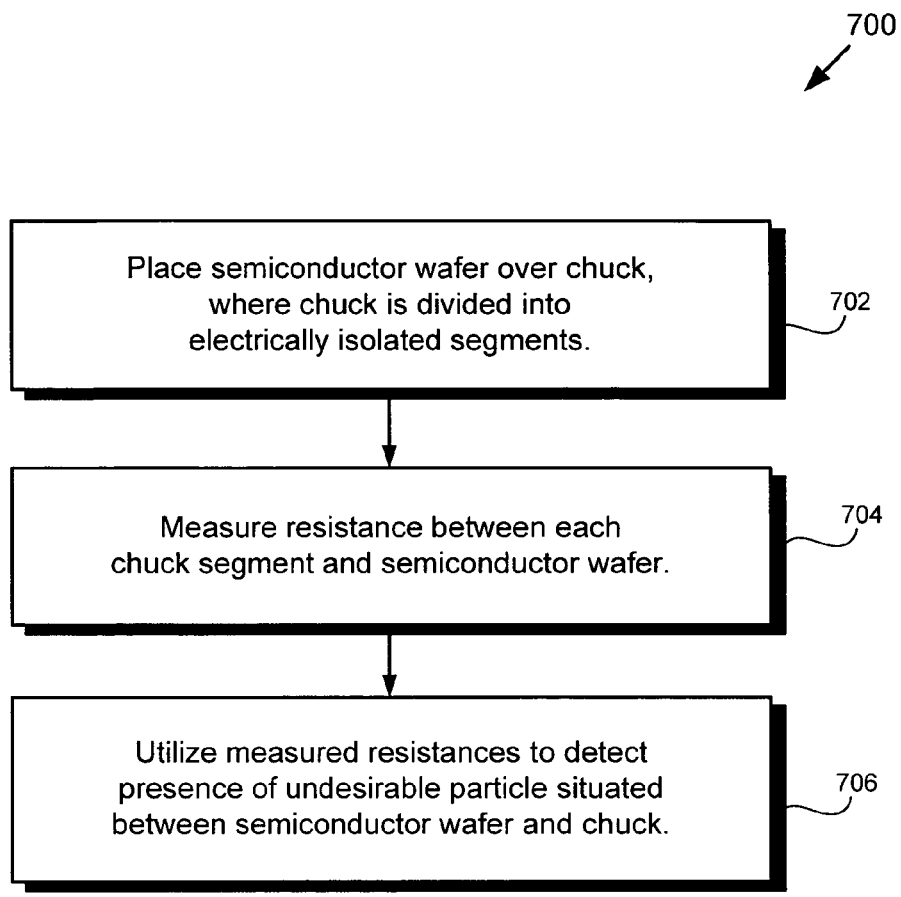
FIG. 7 is a flowchart illustrating steps taken to implement one embodiment of the present invention.

FIG. 7 shows a flowchart illustrating an exemplary method according to an embodiment of the present invention. Certain details and features have been left out of flowchart 700 that are apparent to a person of ordinary skill in the art. For example, a step may consist of one or more substeps or may involve specialized equipment or materials, as known in the art.

System 300 in FIG. 3 is utilized to illustrate the method steps in flowchart 700. At step 702 of flowchart 700, semiconductor wafer 302 is placed over chuck 304. Chuck 304, which is divided into electrically isolated chuck segments 306, 308, and 310 by non-conducting layers, such as non-conducting layer 312, can comprise titanium nitride, a material comprising silicon, or other suitable electrically conductive materials. Semiconductor wafer 302, which comprises a conductive material, and chuck segments 306, 308, and 310, which each comprise a conductive material, are in direct electrical contact with one another.

At step 704 of flowchart 700, the resistance between each chuck segment, i.e., chuck segments 306, 308, and 310, and semiconductor wafer 302 is measured by coupling resistance measuring instrument 328 between the respective chuck segment and semiconductor wafer 302. For example, the resistance between chuck segment 306 and semiconductor wafer 302 can be measured by coupling resistance measuring instrument between chuck segment 306 and semiconductor wafer 302.

At step 706 of flowchart 700, the resistances measured at step 704 of flowchart 700 are utilized to detect the presence of an undesirable particle situated between semiconductor wafer 302 and chuck 304. When an undesirable particle, such as particle 322, is situated between a chuck segment, such as chuck segment 308, and a semiconductor wafer, the undesirable particle causes a change in the resistance between the semiconductor wafer and the chuck segment. Thus, by measuring the respective resistances between semiconductor wafer 302 and chuck segments 306, 308, and 310, an undesirable particle situated between the semiconductor wafer and one or more of chuck segments can be detected. For example, respective resistances between semiconductor wafer 302 and chuck segments 306, 308, and 310 can be measured by utilizing a measuring instrument, such as resistance measuring instrument 328. A difference between one of the resistances and the other resistances can be used to detect the existence of an undesirable particle situated between the chuck segment corresponding to the different resistance and the semiconductor wafer.

In one embodiment, the resistance between each chuck segment and the semiconductor wafer can be measured by a resistance measuring instrument and compared to an appropriately determined reference resistance. A difference between a measured resistance and the reference resistance can be used to detect the existence of an undesirable particle situated between a corresponding chuck segment and the semiconductor wafer.

Thus, in the embodiment in FIG. 7, the invention achieves a method for advantageously detecting the presence of an undesirable particle situated between a semiconductor wafer and a chuck segment by detecting a change in resistance caused by the particle.

FIG. 8 shows a flowchart illustrating an exemplary method according to an embodiment of the present invention. Certain details and features have been left out of flowchart 800 that are apparent to a person of ordinary skill in the art. For example, a step may consist of one or more substeps or may involve specialized equipment or materials, as known in the art.

System 400 in FIG. 4 is utilized to illustrate the method steps in flowchart 800. At step 802 of flowchart 800, mask 402, which includes conducting layer 403 and substrate 401, is placed over chuck 404 such that conducting layer 403 of mask 402 is in contact with electrically isolated chuck segments 406, 408, and 410. Mask 402 can be an EUV (extreme ultraviolet) reflective mask for use in EUV lithography, for example, and conducting layer 403 can comprise a metal or other suitable electrically conductive material. Thus, conducting layer 403 of mask 402, which comprises a conductive material, and chuck segments 406, 408, and 410, which each comprise a conductive material, are in electrical contact with one another.

At step 804 of flowchart 800, the resistance between each chuck segment, i.e., chuck segments 406, 408, and 410, and conducting layer 403 of mask 402 can be measured by coupling resistance measuring instrument 428 between the respective chuck segment and conducting layer 403 of mask 402. For example, the resistance between chuck segment 406 and conducting layer 403 of mask 402 can be measured by coupling resistance measuring instrument between chuck segment 406 and conducting layer 403.

At step 806 of flowchart 800, the resistances measured at step 804 of flowchart 800 are utilized to detect the presence of an undesirable particle situated between conducting layer 403 of mask 402 and chuck 404. When an undesirable particle, such as particle 422, is situated between a chuck segment, such as chuck segment 408, and a mask, the undesirable particle causes a change in the resistance between the mask and the chuck segment. Thus, by measuring the respective resistances between conducting layer 403 of mask 402 and chuck segments 406, 408, and 410, an undesirable particle situated between the mask and one or more of chuck segments can be detected. For example, respective resistances between conducting layer 403 of mask 402 and chuck segments 406, 408, and 410 can be measured by utilizing a measuring instrument, such as resistance measuring instrument 428. A difference between one of the resistances and the other resistances can be used to detect the existence of an undesirable particle situated between the chuck segment corresponding to the different resistance and the mask.

In one embodiment, the resistance between each chuck segment and the mask can be measured by a resistance measuring instrument and compared to an appropriately determined reference resistance. A difference between a measured resistance and the reference resistance can be used to detect the existence of an undesirable particle situated between a corresponding chuck segment and the mask.

Thus, in the embodiment in FIG. 8, the invention achieves a method for advantageously detecting the presence of an undesirable particle situated between a mask and a chuck segment by detecting a change in resistance caused by the particle.

Thus, as discussed above, the present invention provides a system and method for advantageously detecting the existence of an undesirable particle situated between a planar lithographic object, such as a semiconductor wafer or a lithographic mask, and a chuck by measuring a change in an electrical characteristic, such as capacitance or resistance, formed by and between the chuck and the planar lithographic object caused by the undesirable particle. It is apparent to one of ordinary skill in the art that the innovative methods and systems described herein can be utilized to fabricate production semiconductor dies from the semiconductor wafers and/or the lithographic masks used in the invention's methods and systems as described above. For example, it is apparent that if undesirable particles between the chuck and the semiconductor wafer (or between the chuck and the mask) are not detected, the semiconductor wafer can continue to be completely fabricated and production dies can result from the semiconductor wafer so fabricated.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, method and system for detecting existence of an undesirable particle during semiconductor fabrication have been described.

The invention claimed is:

1. A method for detecting a presence of at least one undesirable particle between a planar lithographic object and a chuck during semiconductor fabrication, said method comprising:
    placing said planar lithographic object over said chuck;
    measuring a change in at least one electrical characteristic formed by and between said chuck and said planar lithographic object caused by said undesirable particle;
    determining said presence of said at least one undesirable particle between said planar lithographic object and said chuck based on said change in said at least one electrical characteristic.

2. The method of claim 1 wherein said planar lithographic object is a semiconductor wafer.

3. The method of claim 1 wherein said planar lithographic object is a mask having a conducting layer facing said chuck.

4. The method of claim 3 wherein said mask is an EUV reflective mask.

5. The method of claim 1 wherein said at least one electrical characteristic is a capacitance formed by and between said chuck and said planar lithographic object.

6. The method of claim 5 wherein an insulating layer is situated over said chuck and between said chuck and said planar lithographic object.

7. The method of claim 1 wherein said at least one electrical characteristic is a resistance between said chuck and said planar lithographic object.

8. The method of claim 1 wherein said chuck is divided into electrically isolated chuck segments.

9. A system for detecting a presence of at least one undesirable particle during semiconductor fabrication, said system comprising:
    a chuck and a planar lithographic object situated over said chuck;
    a measuring instrument that measures at least one electrical characteristic coupled across said chuck and said planar lithographic object to detect a change in said at least one electrical characteristic formed by and between said planar lithographic object and said chuck caused by said undesirable particle situated between said planar lithographic object and said chuck.

10. The system of claim 9 wherein said planar lithographic object is a semiconductor wafer.

11. The system of claim 9 wherein said planar lithographic object is a mask having a conducting layer facing said chuck.

12. The system of claim 9 wherein said at least one electrical characteristic is a capacitance formed by and between said chuck and said planar lithographic object.

13. The system of claim 9 wherein said at least one electrical characteristic is a resistance between said chuck and said planar lithographic object.

14. The system of claim 9 wherein said measuring instrument is a capacitance measuring instrument.

15. The system of claim 9 wherein said measuring instrument is a resistance measuring instrument.

* * * * *